United States Patent [19]

Satoh

[11] Patent Number: 5,027,173
[45] Date of Patent: Jun. 25, 1991

[54] SEMICONDUCTOR MEMORY DEVICE WITH TWO SEPARATE GATES PER BLOCK

[75] Inventor: Shinichi Satoh, Hyogo, Japan

[73] Assignee: Mitsubishi Denki Kabushiki Kaisha, Tokyo, Japan

[21] Appl. No.: 261,022

[22] Filed: Oct. 20, 1988

[30] Foreign Application Priority Data

Nov. 17, 1987 [JP] Japan .................................. 62-291337

[51] Int. Cl.$^5$ ...................... H01L 29/68; H01L 29/06; H01L 27/02
[52] U.S. Cl. ..................................... 357/23.6; 357/55; 357/41
[58] Field of Search ................................ 357/23.6, 55

[56] References Cited

U.S. PATENT DOCUMENTS

| 4,651,184 | 3/1987 | Malhi | 357/23.6 |
| 4,672,410 | 6/1987 | Miura et al. | 357/55 |

FOREIGN PATENT DOCUMENTS

| 3525418 | 1/1986 | Fed. Rep. of Germany .. | |
| 022665 | 1/1986 | Japan | 357/23.6 |
| 285753 | 12/1986 | Japan | 357/23.6 |
| 67862 | 3/1987 | Japan . | |
| 200758 | 9/1987 | Japan | 357/23.6 |
| 200759 | 9/1987 | Japan | 357/23.6 |
| 104466 | 5/1988 | Japan . | |
| 124455 | 5/1988 | Japan . | |

OTHER PUBLICATIONS

IEDM 84: "A Folded Capacitor Cell for Future Megabit DRAMs", by M. Wada et al., 9.5, 1984, pp. 244–247.
IEDM 85: "A Trench Transistor Cross-Point DRAM Cell", by W. F. Richardson et al., 29.6 1985, pp. 714–717.
IEDM 84: "Buried Isolation Capacitor (BIC) Cell for Megabit MOS Dynamic RAM", by K. Nakamura et al, 9.3, 1984, pp. 236–239.

Primary Examiner—Rolf Hille
Assistant Examiner—Robert P. Limanek
Attorney, Agent, or Firm—Lowe, Price, LeBlanc, Becker & Shur

[57] ABSTRACT

A semiconductor memory device comprises a semiconductor substrate (10), a trench (12) formed on a main surface (11) of the semiconductor substrate, a gate region (15) formed on a main surface portion in the trench, a passive element region (16) formed on a bottom side portion of the trench and a source/drain region (20) formed on the main surface of the semiconductor substrate. The method for manufacturing the semiconductor memory device comprises the steps of forming a wide first trench (31) on a portion of the main surface of the semiconductor substrate, forming a narrow second trench (32) on the bottom portion of the first trench, forming a passive element region in the second trench, forming a gate region in the first trench, and forming a source/drain region on the main surface portion of the semiconductor substrate.

13 Claims, 4 Drawing Sheets

SEMICONDUCTOR MEMORY DEVICE WITH TWO SEPARATE GATES PER BLOCK

BACKGROUND OF THE INVENTION

1. Field of the Invention

The present invention relates to a semiconductor memory device and a method for manufacturing the same and, more specifically, it relates to a semiconductor memory device suitable for a 1 transistor-1 capacitor type dynamic RAM and a method for manufacturing the same.

Co-pending applications related to the present invention are USSN No 904,843, USSN No. 075,083 and USSN No. 104,921.

2. Description of the Prior Art

As the dynamic RAM has become smaller and smaller, the capacitor regions become smaller and the amount of charges stored therein also becomes smaller. As a result, it becomes a serious problem that the reliability is lowered due to soft errors or the like. Various improvements are proposed to increase the storage capacitance. One of these improvements is a trench capacitor cell, in which a trench is formed in the semiconductor substrate. Related prior arts are Japanese Patent Laying-Open Gazette No. 67862/1987, M. WADA et al. "A folded Capacitor Cell (F.C.C.) for Future Megabit DRAMs", IEDM, Tech. Dig. pp. 244-247, (1984), K. Nakamura et al. "Buried Isolation Capacitor Cell (BIC) for Megabit MOS Dynamic RAM", IEDM, Tech. Dig. pp. 236-239, (1984), W.F. Richardson et al., "A Trench Transistor Cross-Point DRAM Cell", IEDM, Tech. Dig. p. 714 (1985). In addition, Japanese Patent Laying-Open Gazette No. 104466/1988 and Japanese Patent Laying-Open Gazette No. 124455/1988 are also related to the present invention, although they became known after the priority date of the present application.

FIG. 4 shows an example of the prior art which is called an isolation-combination type trench capacitor cell.

Referring to FIG. 4, a plurality of blocks 1 (only one is shown) are formed on a main surface of the semiconductor substrate, each formed to be approximately rectangular solid, four sides thereof surrounded by trenches 2 formed lengthwise and breadthwise. A pair of switching transistor regions 4 (only one is shown) is arranged on the block 1 on the side of the main surface 3 of the semiconductor substrate. A pair of capacitor regions 5 (only one is shown) is arranged on a pair of side wall surfaces of the block 1 which are parallel to each other.

A gate oxide film 6a and a gate electrode 6b thereon are formed on that portion of the main surface 3 which is near the said capacitor region 5 in the said switching transistor region 4. A pair of source/drain regions 7 and 8 is formed on the side of the main surface 3 of the block 1 sandwiching the gate oxide film 6a and the gate electrode 6b.

In the said capacitor region 5, a capacitor electrode layer 9 is formed on the side wall surface of the block 1. The upper end portion of the capacitor electrode layer 9 is connected to one source/drain region 8. Although omitted in FIG. 4, an insulating layer and a second electrode layer are arranged in the trench 2, forming, together with the electrode layer 9, the capacitor region 5.

Although not shown, a bit line is connected to the source/drain region 7 and a word line is connected to the gate electrode 6b. The said switching transistor region 4 and the capacitor region 5 form one memory cell of a 1 transistor-1 capacitor type dynamic RAM.

In the above mentioned conventional semiconductor memory device, the transistor region 4 and the capacitor region 5 should be isolated from each other. Therefore, the capacitor region 5 can be formed only on two sides out of four sides of each block 1. For this reason, in the said conventional semiconductor memory device, the capacitor area could not be made large enough to ensure a large amount of charge to be stored.

SUMMARY OF THE INVENTION

An object of the present invention is to provide a semiconductor memory device which comprises a large number of minute passive elements having wider region on the side wall of the block.

Another object of the present invention is to provide a method for manufacturing such semiconductor memory device.

The semiconductor memory device in accordance with the present invention comprises a semiconductor substrate; a trench formed on a main surface of the semiconductor substrate; a gate region formed on a portion on the main surface in the trench; a passive element region formed on a portion on the lower side of the trench; and a source/drain region formed on the main surface of the semiconductor substrate.

A method for manufacturing the semiconductor memory device in accordance with the present invention comprises the steps of forming a wide first trench on a portion on a main surface of a semiconductor substrate; forming a narrow second trench on a bottom portion of the first trench; forming a passive element region in the second trench; forming a gate region in the first trench; and forming a source/drain region on a portion on the main surface of the semiconductor substrate.

According to the present invention, the gate region is formed on a portion on the main surface in the trench formed on the semiconductor substrate, a passive element is formed on a bottom portion of the trench, and a source/drain region is formed on the side of the main surface of the semiconductor substrate.

Consequently, even if the passive element region extends from the side wall surface of a trench to the side wall surface of another continuous trench, there is always a gate region extending between the passive element region and the source/region. Therefore, even if a passive element region is formed on the side wall surface of a trench and the region is extended to the side wall surface of a continuous trench, there will be no short-circuit between the passive element region and the source/drain region. Namely, according to the present invention, the passive element region can be formed not only on one side wall surface of a trench but also continuously on the side wall surface of a continuous trench, thereby ensuring larger area of the passive element. In other words, according to the present invention, the amount of charges to be stored in the passive element region can be increased, whereby the semiconductor memory device can be easily minimized.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
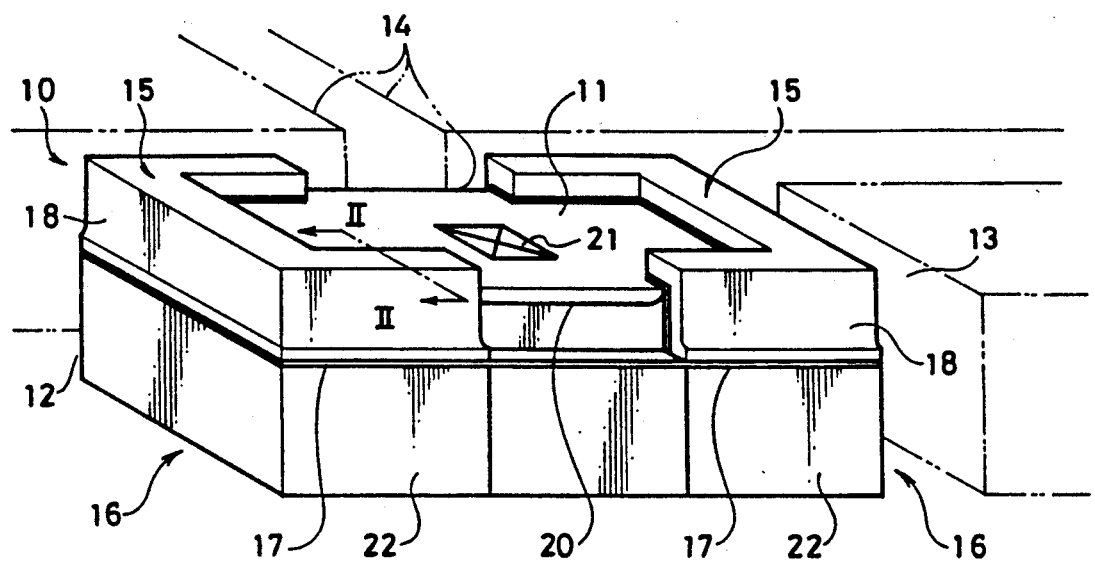
FIG. 1 is a partial vertical sectional view of one example of the semiconductor memory device in accordance with the present invention.
Figure 2:
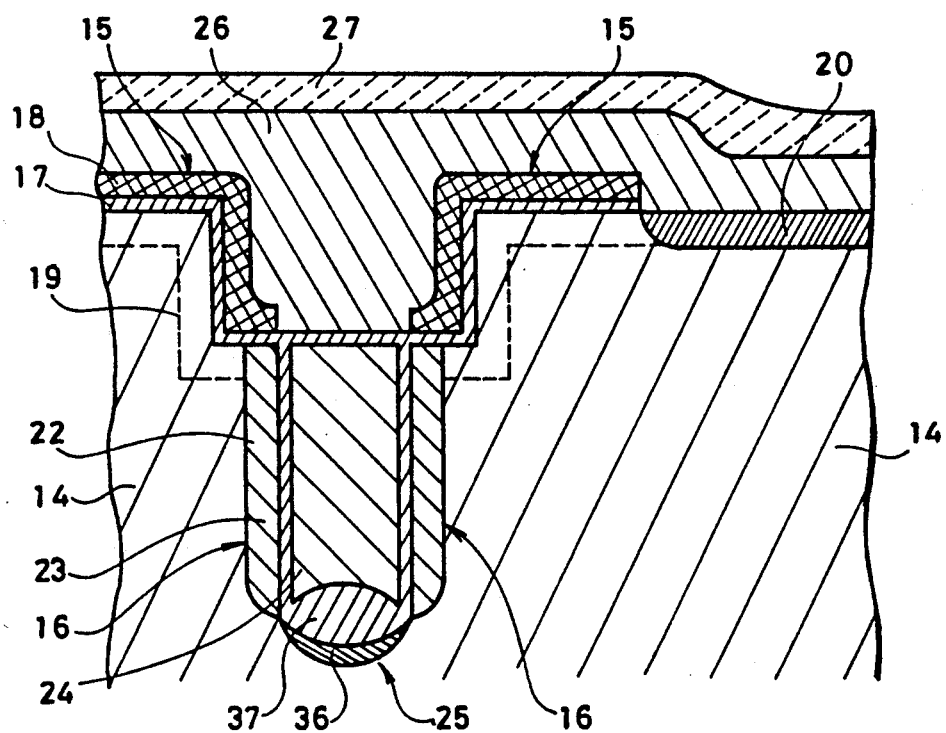
FIG. 2 is a cross sectional view taken along the line II—II of FIG. 1.

One example of the semiconductor memory device in accordance with the present invention is shown in FIGS. 1 and 2. In FIG. 1, bit lines, word lines, an insulating film for isolating elements, a final protecting film and the members embedded in the trench are omitted for convenience of understanding.

Referring to FIG. 1, trenches 12 and 13 of several μm to several ten μm are formed lengthwise and breadthwise on a main surface 11 of a semiconductor substrate 10. Namely, the portion on the main surface 11 of the semiconductor substrate 10 are divided into a plurality of regions by the trenches 12 and 13, with each of the divided regions forming a block 14 having approximately rectangular solid form. Each block 14 comprises a pair of gate regions 15 and a pair of passive element regions 16 respectively spaced apart from each other.

The gate regions 15 are formed on upper portions of a pair of sides parallel to each other out of the four sides of the block 14 and extended to the remaining sides intersecting therewith. The gate regions 15 are also extended to the edge portion of the main surface 11. As is shown in FIG. 2, the gate region 15 comprises a thin gate oxide film 17 formed on the surface of each block 14, a gate electrode 18 formed on the gate oxide film 17 and a channel region 19 formed below the gate oxide film 17 for controlling the threshold value. A source/drain region 20 is formed on a portion on the side of the main surface 11. The said gate oxide film 17, the gate electrode 18 and the channel region 19 extend from the edge of the source/drain region 20 along the surface of the block 14 to the upper end portion of the capacitor region 16. As is shown in FIG. 1, a bit line connecting region 21 is provided at the center of the source/drain region 20 to which a bit line, not shown, is connected.

The said capacitor region 16 is formed below the gate region 15 on the side wall surface of the block 14 and in the trenches 12 and 13. The capacitor region 16 extends along the gate region 15 from a pair of parallel side wall surfaces of the block 14 continuously to the side of the side wall surfaces crossing the said side wall surfaces. As shown in FIG. 2, a second electrode layer 22 is formed on the side wall surface of the block 14 below the gate region 15. A thin insulating layer 23 integrally continuous to the gate oxide film 17 is formed on the surface of the second electrode layer 22. A first electrode layer 24 (cell plate) is arranged on the surface of the insulating layer 23 to fill the trench. An isolating region 25 is formed on the lower end portion of the capacitor region 16, and a pair of capacitor regions 16 opposed to each other is isolated from each other by the isolating region 25. The upper surface of the semiconductor substrate 10 including the block 14 and the gate region 15 is covered with an oxide film 26 for isolating elements and a final protecting film 27 is arranged thereon. A bit line, not shown, is connected to the bit line connecting region 21, and a word line, not shown, is connected to the gate region 15.

The operation of the semiconductor memory device in accordance with the present invention will be described in the following.

The information "1" or "0" from a bit line, not shown, is stored in the capacitor region 16 through the source/drain region 20 and the channel region 19. The writing and reading of the information is carried out by the opening/closing of the gate region 15.

The capacitor region 16 used for storing the information is formed widely along the side wall surface of the trenches 12 and 13, that is, the side wall surface of the block 14. The capacitor region 16 extends not only on the pair of side wall surfaces parallel to each other of the block 14 but also to the side wall surfaces intersecting therewith. Therefore, in this case, a capacitor region 16 relatively wide compared with the prior art can be provided. Namely, the structure provides wider capacitor area and therefore large amount of charges to be stored in the capacitor region 16, whereby the semiconductor memory device can be minimized without causing degradation of reliability due to the soft errors and the like.

Although the capacitor region 16 extends not only on a pair of side wall surfaces parallel to each other of the block 14 but also to the side wall surfaces intersecting therewith, there will be no short-circuit between the source/drain region 20 and the capacitor region 16 since there is always a gate region 15 existing between the source/drain region 20 and the capacitor region 16.

The method for manufacturing the semiconductor memory device in accordance with the present invention will be described in the following.

Figure 3A:
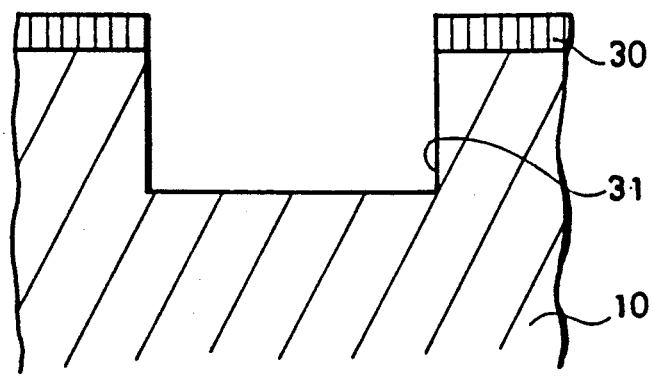
FIGS. 3A to 3E are partial vertical sectional views illustrating the method for manufacturing the semiconductor memory device in accordance with the present invention.
Figure 3B:
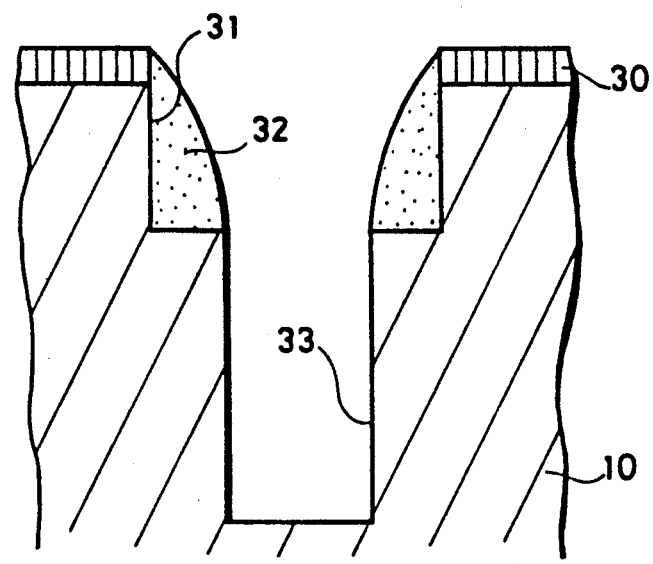

First, referring to FIG. 3A, an upper surface of a semiconductor substrate 10 is covered by a silicon oxide film 30 and patterning is carried out. A wide first trench 31 is formed by reactive ion etching (RIE) using the silicon oxide film 30 as a mask. Thereafter, a silicon oxide film is again formed on the entire surface. The entire surface is etched by RIE so as to expose the bottom surface of the first trench 31. On this occasion, there will be the residue 32 of the said silicon oxide film on the side wall surface of the trench 31 to form side walls. The bottom surface of the first trench 31 is etched by RIE using the residue 32 as a mask to form a narrow second trench 33 such as shown in FIG. 3B. These trenches 31 and 33 constitute the said trenches 12 and 13 (FIG. 1).

Figure 3C:
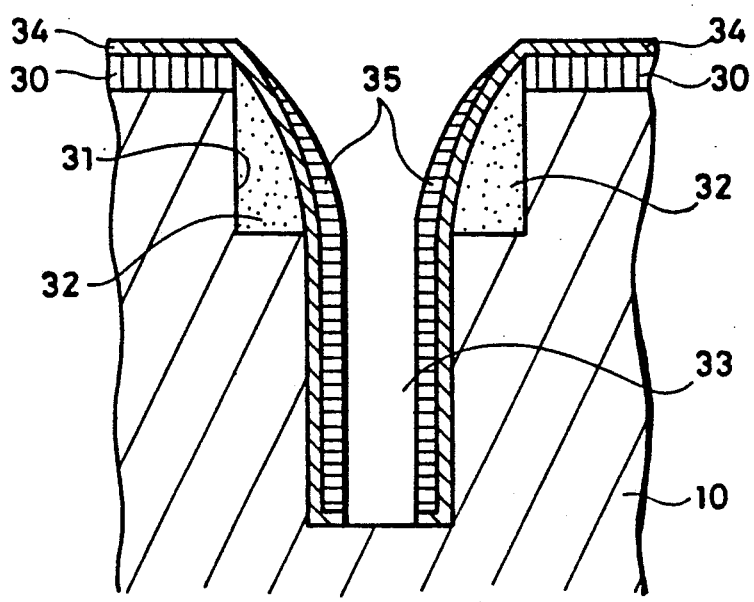

Thereafter, as shown in FIG. 3C, a silicon nitride film 34 is formed on the entire surface. Next, a silicon oxide film is formed thereon, and side walls are formed by leaving the residue 35 of the silicon oxide film only on the side wall portions of the trenches 31 and 32 by RIE. The silicon nitride film 34 on the bottom portion of the second trench 33 is removed using the residue 35 as a mask, whereby a structure shown in FIG. 3C is brought about. Thereafter, an impurity layer 36 of the same conductivity type as the semiconductor substrate 10 is formed on the bottom portion of the second trench 33, and a thick silicon oxide film 37 is formed thereon. The impurity layer 36 and the silicon oxide film 37 constitute an isolating region 25.

Figure 3D:
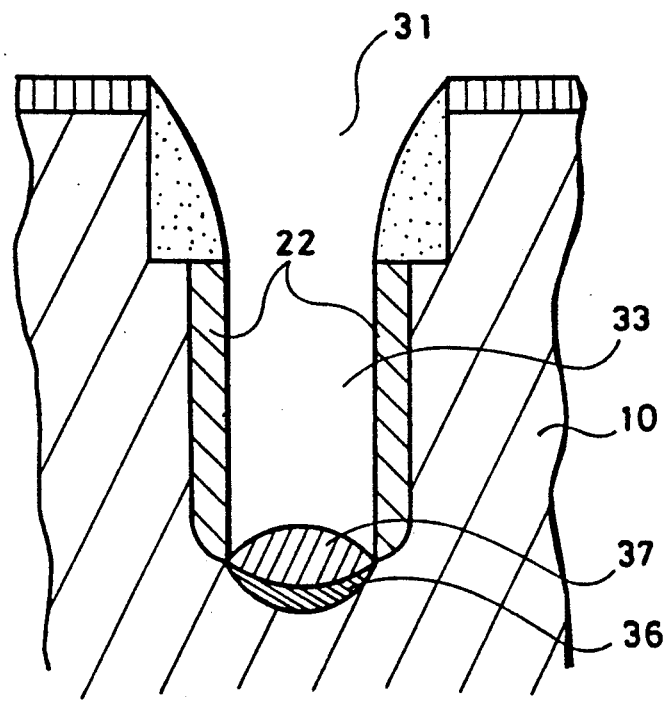
Figure 3E:
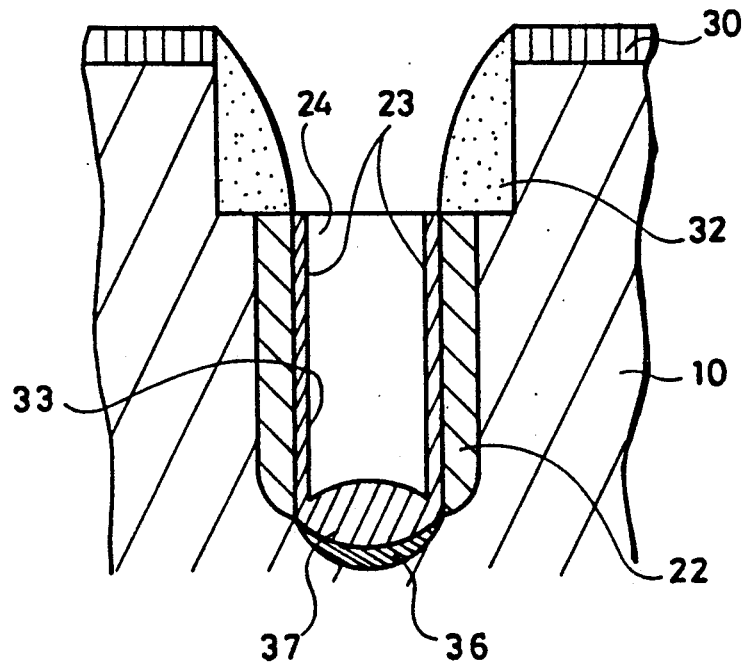
Figure 4:
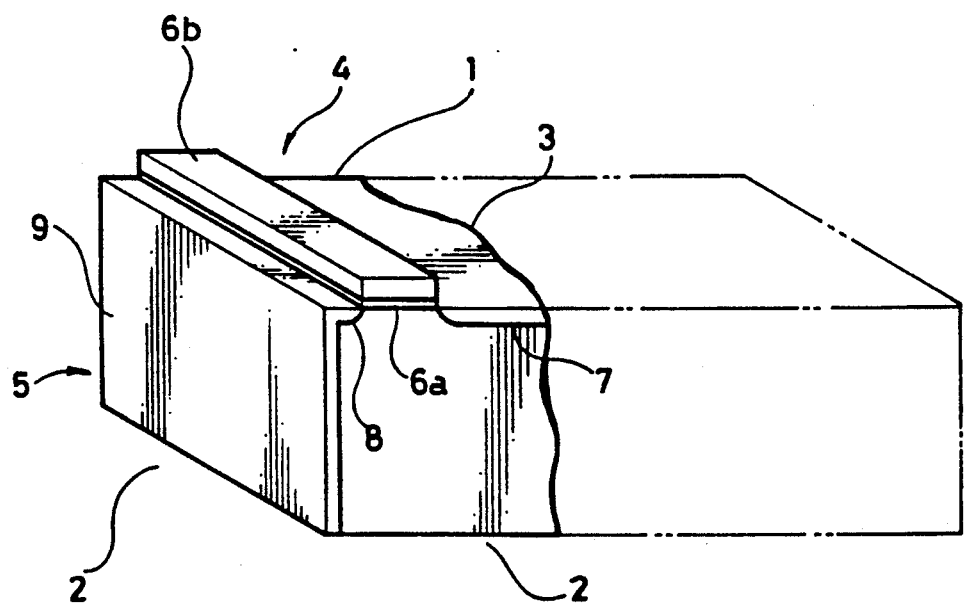
FIG. 4 is a partial view of a conventional semiconductor memory device, corresponding to FIG. 1.

Thereafter, the residue 35 of the said silicon oxide film and the silicon nitride film 34 are removed. Then, impurities of the opposite conductivity type to the substrate 10 are doped to the exposed side wall surfaces of the second trench 33 to form the second electrode layer 22 as shown in FIG. 3D. Then, a thin insulating layer 23 is formed on the surface of the second electrode layer 22. A first electrode layer 24 formed of polycrystalline silicon is formed to fill the second trench 33 to provide the structure of FIG. 3E.

Finally, the silicon oxide film 30 and the residue 32 serving as masks are removed and impurities are doped to the channel region 19 to control the threshold value. A gate oxide film 17 formed of a silicon oxide film is formed, and a gate electrode 18 is formed successively. In this case also, an electrode 18 is selectively formed on the side wall of the trench and on the flat surface portion by RIE. Then, the source/drain region 20 is formed.

An oxide film 26 for isolating elements is formed, bit lines and word lines, not shown, are formed and the whole structure is covered with a final protecting film. By the above described method, a structure can be provided in which a capacitor portion and a transistor portion are formed separate from each other in one trench in an isolation-combination type trench capacitor cell. As a minimized memory cell.

It goes without saying that the method can be applied not only to the 1 transistor-1 capacitor type dynamic RAM but also to switching devices requiring combination of more than two elements such as a resistance and a capacitor in a static RAM in which a high resistance wiring, a transistor, a capacitor and the like are formed in a cell. This enables high degree of integration by separately forming more than two elements in a trench.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a semiconductor substrate (1);
first and second pairs of substantially parallel trenches formed on a major surface (11) of said semiconductor substrate (1), said first pair of trenches arranged substantially orthogonal to said second pair of trenches thereby defining a rectangular block (14) in said substrate (1);
first and second gate regions (15) formed spaced apart on said major surface (11) along opposite side wall surfaces of said block (14) formed by said parallel trenches, said first and second gate regions (15) being electrically isolated from each other;
a passive element region (16) formed on bottom portions of said trenches; and
a source/drain region (20) common to said first and second gate regions (15) formed on the major surface of said semiconductor substrate (11).

2. A semiconductor memory device according to claim 1, wherein said first and second gate regions each extend along side wall surfaces of said block adjacent respective ones of said opposite side wall surfaces.

3. A semiconductor memory device comprising:
a semiconductor substrate (1);
first and second pairs of substantially parallel trenches formed on a major surface (11) of said semiconductor substrate (1), said first pair of trenches arranged substantially orthogonal to said second pair of trenches thereby defining a rectangular block (14) in said substrate (1);
first and second gate regions (15) formed spaced apart on said major surface (11) along opposite side wall surfaces of said block (14) formed by said parallel trenches, said first and second gate regions (15) being electrically isolated from each other;
first and second capacitive elements formed on respective portions of said trenches adjacent said first and second gate regions, respectively, each of said capacitive elements including an electrode layer embedded in said respective portions of said trenches; and
a third source/drain region (20) common to said first and second gate regions (15) formed on the major surface of said semiconductor substrate (11).

4. A semiconductor memory device according to claim 3, wherein said first and second gate regions each extend along side wall surfaces of said block adjacent respective ones of said opposite side wall surfaces.

5. A semiconductor memory device comprising:
a semiconductor substrate (1);
a substantially rectangular trench (12) formed on a major surface (11) of said semiconductor substrate (1) forming a substantially rectangular block (14) in said substrate;
a pair of gate regions (15) formed on said major surface along upper portions of opposite side walls of said block;
a passive element region (16) formed on a bottom portion of said trench adjacent said opposite side walls of said trench; and
a source/drain region (20) common to said pair of gate regions (15) formed on the major surface of said semiconductor substrate (11).

6. A semiconductor memory device according to claim 5, wherein said pair of gate regions each extend along adjacent side wall surfaces of said block adjacent respective ones of said opposite side wall surfaces.

7. A semiconductor memory device according to claim 5, wherein said passive element region includes first and second capacitive elements formed on respective portions of said trenches adjacent said first and second gate regions, respectively, each of said capacitive elements including (a) an electrode layer embedded said respective portions of said trenches, (b) an insulating layer formed between said first electrode layer and the wall surface of the trenches, and (c) a second electrode layer formed on said wall surfaces of the trenches at a position corresponding to the insulating layer.

8. A semiconductor memory device according to claim 1, wherein said trench comprises an isolating region at a bottom portion, and a pair of passive element regions is isolated from each other by said isolating region.

9. A semiconductor memory device according to claim 8, wherein each of said gate regions extends to an edge portion of the main surface of said semiconductor substrate.

10. A semiconductor memory device according to claim 9, wherein each of said gate regions and said passive element region are provided on each of side wall surfaces arranged spaced apart from each other o each said block.

11. A semiconductor memory device according to claim 8, wherein each of said gate regions comprises a gate electrode formed on the side wall surface portion of said trench, a gate oxide film formed below the gate electrode, and a channel region below the gate oxide film.

12. A semiconductor memory device according to claim 11, wherein said passive element region is a capacitor comprising a first electrode layer embedded in said trench, an insulating layer arranged between said first electrode layer and the wall surface of the trench, and a second electrode layer formed on said wall surface of the trench at a position corresponding to the insulating layer.

13. A semiconductor memory device according to claim 12, wherein said second electrode layer is arranged adjacent to said gate region, thereby serving as a second source/drain region, and each of said gate region, said source/drain region and said second electrode layer constituting a switching element.

* * * * *